United States Patent
Kalluru et al.

(10) Patent No.: US 11,443,778 B1
(45) Date of Patent: Sep. 13, 2022

(54) PEAK CURRENT REDUCTION USING DYNAMIC CLOCKING DURING CHARGE PUMP RECOVERY PERIOD

(71) Applicant: Micron Technology, Inc., Boise, ID (US)

(72) Inventors: Vivek Venkata Kalluru, San Jose, CA (US); Michele Piccardi, Cupertino, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/224,540

(22) Filed: Apr. 7, 2021

(51) Int. Cl.
*G11C 5/14* (2006.01)

(52) U.S. Cl.
CPC ................. *G11C 5/145* (2013.01)

(58) Field of Classification Search
CPC ........................................ G11C 5/145
USPC .................................... 365/185.18
See application file for complete search history.

(56) References Cited

U.S. PATENT DOCUMENTS

| | | | | |
|---|---|---|---|---|
| 8,710,883 B1* | 4/2014 | Fang | ..................... | H03L 7/0995 327/148 |
| 2011/0188621 A1* | 8/2011 | Asaduzzaman | ......... | H03L 7/087 375/374 |
| 2013/0320955 A1* | 12/2013 | Kratyuk | ................... | G05F 3/242 323/313 |
| 2018/0190360 A1* | 7/2018 | Seo | ........................ | H02M 3/07 |

\* cited by examiner

*Primary Examiner* — Anthan Tran
(74) *Attorney, Agent, or Firm* — Lowenstein Sandler LLP

(57) ABSTRACT

A system includes a charge pump to charge wordlines of a memory array, a pump regulator coupled including a level detector, and dynamic clock logic coupled between the level detector and an oscillator. The logic provides clock signals to the charge pump and is to perform operations including: detecting that the charge pump has entered a recovery period; causing the oscillator to output, to the charge pump during a first time period of the recovery period, a first clock signal comprising a lower frequency than output during a time period preceding the recovery period; detecting that a voltage level from the level detector satisfies a trip point criterion; and causing the oscillator to output, to the charge pump during a second time period of the recovery period and responsive to the detecting, a second clock signal comprising a higher frequency than output during the time period preceding the recovery period.

20 Claims, 10 Drawing Sheets

PEAK CURRENT REDUCTION USING DYNAMIC CLOCKING DURING CHARGE PUMP RECOVERY PERIOD

TECHNICAL FIELD

Embodiments of the disclosure relate generally to memory sub-systems, and more specifically, relate to peak current reduction using dynamic clocking during charge pump recovery.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
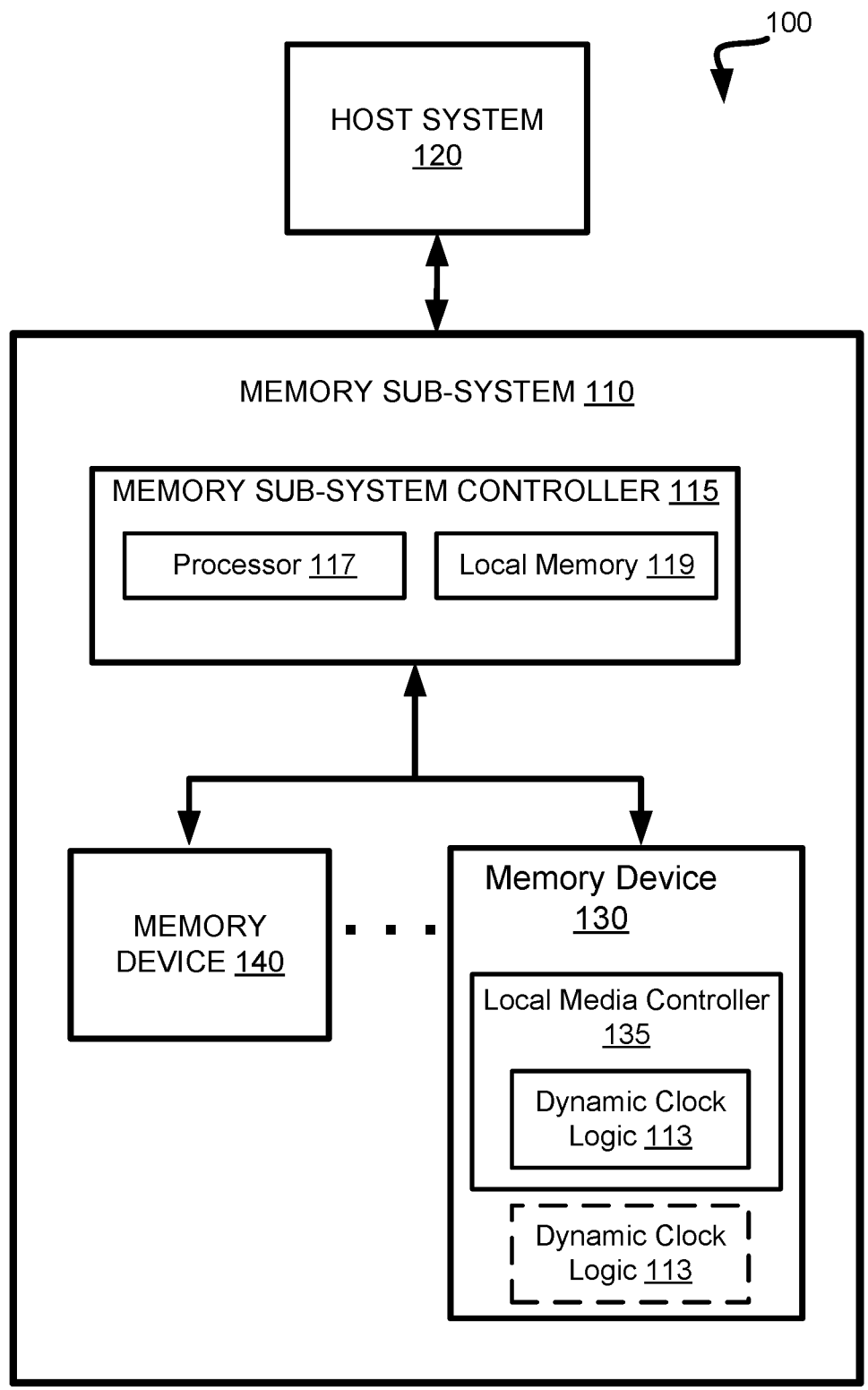
FIG. 1 is an example computing system that includes a memory sub-system in accordance with some embodiments.

Aspects of the present disclosure are directed to peak current reduction using dynamic clocking during charge pump recovery. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below with reference to FIG. 1. A non-volatile memory device is a package of one or more memory dies. Each die can consist of one or more planes. For some types of non-volatile memory devices (e.g., NAND devices), each plane includes a set of physical blocks. Each block consists of a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

A memory device can be made up of bits arranged in a two-dimensional grid or a three-dimensional grid. Memory cells are formed onto a silicon wafer in an array of columns (also hereinafter referred to as "bitlines") and rows (also hereinafter referred to as "wordlines"). A wordline can refer to one or more rows of memory cells of a memory device that are used with one or more bitlines to generate the address of each of the memory cells. The intersection of a bitline and wordline constitutes the address of the memory cell. In some embodiments, a local wordline (LWL) makes reference to a single row of memory cells that is individually programmable. Multiple local wordlines (LWLs), one per array block of memory, can be connected to a corresponding global wordline (GWL) in a many-to-one relationship, e.g., so that the corresponding LWLs can be controlled via a GWL.

To program data to a memory sub-system, a local media controller of a memory device can cause a voltage generated by an on-die charge pump and charge pump regulator to be applied across the gates of a NAND device to trap charges (e.g., electrons) in the gate of the NAND. The local media controller can cause the voltage be applied in one or more pulses, known as program pulses, to a wordline associated with memory cells. The amount of voltage and the width of each pulse can determine the amount of charge that will be stored at the NAND device, and in turn programs the state of a memory cell of the NAND. A series of pulses can be applied to a wordline in order to gradually raise the memory cell to target threshold voltage (Vt) while not over-programming the memory cell.

In certain memory devices, the charge pump generates a peak current (or power), which has to be controlled in a way that limits system performance in a multi-die package. Charge pump peak currents contribute to overall peak currents in a NAND die (or other similar memory component). Some designs use a static clock to control the charge pump. Slowing down the static clock improves (e.g., reduces) peak current (or power) but at the cost of performance loss due to the slower clock. For example, a slower clock means that the program pulses used to program the memory cells are cycled at a lower frequency. Further, read operations that also charge the wordlines are slowed as well.

Aspects of the present disclosure address the above and other deficiencies by providing a memory device that integrates, on die, a dynamic clock that can be controlled differently when peak current is detected as opposed to under normal, non-peak-current operation. More specifically, the dynamic clock can be coupled between the pump regulator and the pump. Upon detecting a peak current, the dynamic clock can slow down the clock, e.g., run at a lower frequency. A peak current can be expected or detected, for example, when a feedback signal from the pump regulator disables the pump in transitioning into a recovery period when the wordlines (and/or bit lines) are discharged. Upon detecting a moment or time period of non-peak current (such as later in the recovery period), the dynamic clock can speed up the clock, e.g., run at a higher frequency. The time periods during which the dynamic clock is run at a higher frequency can offset the time periods during which the dynamic clock is run at a lower frequency, and thus not take any performance hit in curtaining peak current or power.

In various embodiments, the dynamic clock can be implemented in different ways. In one embodiment, dynamic clock logic detects peak current timing in addition to trip points at which to transition an oscillator, which generates the clock signal, to increasingly higher frequency. The trip points can enable breaking up clock transitions within the recovery period such that performance savings in time periods of higher frequency offset performance losses during time periods of lower frequency. In a second embodiment, a voltage-controlled oscillator can be controlled with trim bits from such dynamic clock (or other control) logic, causing the clock signal outputs to vary depending on a voltage level directly received from the charge pump. In a third embodiment, a trim-controlled clock can be controlled with trim bits that cause frequency stepping within the clock. While not continuously-controlled, such a trim-controlled clock can still nonetheless be programmed with steps in increasingly higher frequency within the recovery period where the recovery period start and end times are known or predictable.

Therefore, advantages of the systems and methods implemented in accordance with some embodiments of the present disclosure include, but are not limited to, the ability to control the reduction of charge pump peak current (to include a minimization of charge pump peak current and power) without sacrificing performance and while incurring negligible area costs (from additional logic). These advantages can be achieved by employing a dynamic clock that drives a charge pump as opposed to a static clock as will be discussed in more detail and according to various embodiments. Other advantages will be discussed and still others will be apparent to those skilled in the art having the benefit of this disclosure.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device. The memory device 130, for example, can represent a single die having some control logic (e.g., local media controller 135) embodied thereon. In some embodiments, one or more components of memory sub-system 110 are omitted.

In one embodiment, the memory device 130 includes dynamic clock logic 113 that can be used to dynamically generate multiple clock signals to drive a charge pump, which charges wordlines of the memory device 130, at different frequencies depending on detected or expected peak currents during a recovery period of the charge pump. In some embodiments, the local media controller 135 includes at least a portion of the dynamic clock logic 113.

Figure 2A:
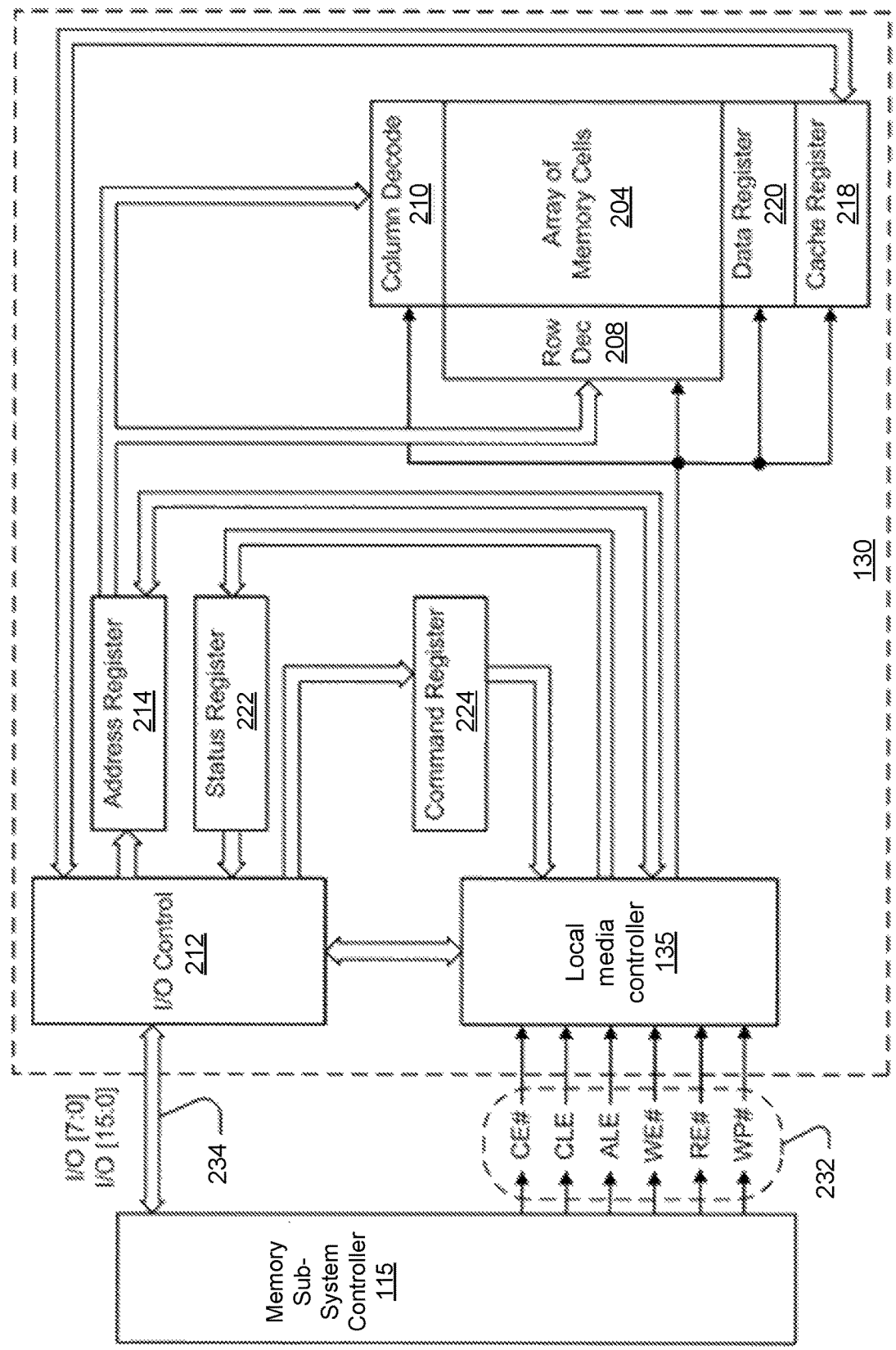
FIG. 2A is a block diagram of a memory device in communication with a memory sub-system controller of a memory sub-system, according to an embodiment.

FIG. 2A is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like.

The memory sub-system controller 115 (e.g., a controller external to the memory device 130), can be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line can be associated with more than one logical row of memory cells and a single data line can be associated with more than one logical column. Memory cells (not individually illustrated) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic 216 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data can be passed from the cache register 218 to the data register 22 for transfer to the array of memory cells 204; then new data can be latched in the cache register 218 from the I/O control circuitry 212. During a read operation, data can be passed from the cache register 218 to the I/O control circuitry 212 for output to the memory sub-system controller 115; then new data can be passed from the data register 220 to the cache register 218. The cache register 218 and/or the data register 220 can form (e.g., can form a portion of) a page buffer of the memory device 130. A page buffer can further include sensing devices (not shown in FIG. 2A) to sense a data state of a memory cell of the array of memory cells 204, e.g., by sensing a state of a data line connected to that memory cell. A status register 222 can be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable (CE #), a command latch enable (CLE), an address latch enable (ALE), a write enable (WE #), a read enable (RE #), and a write protect (WP #). Additional or alternative control signals (not shown) can be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands can be received over input/output (I/O) pins [7:0] of I/O bus 234 at I/O control circuitry 212 and can then be written into command register 224. The addresses can be received over input/output (I/O) pins [7:0] of I/O bus 234 at I/O control circuitry 212 and can then be written into address register 214. The data can be received over input/output (I/O) pins [7:0] for an 8-bit device or input/output (I/O) pins [15:0] for a 16-bit device at I/O control circuitry 212 and then can be written into cache register 218. The data can be subsequently written into data register 220 for programming the array of memory cells 204.

In an embodiment, cache register 218 can be omitted, and the data can be written directly into data register 220. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2A has been simplified. It should be recognized that the functionality of the various block components described with reference to FIG. 2A may not necessarily be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A.

Additionally, while specific I/O pins are described in accordance with popular conventions for receipt and output of the various signals, it is noted that other combinations or numbers of I/O pins (or other I/O node structures) can be used in the various embodiments.

Figure 2B:
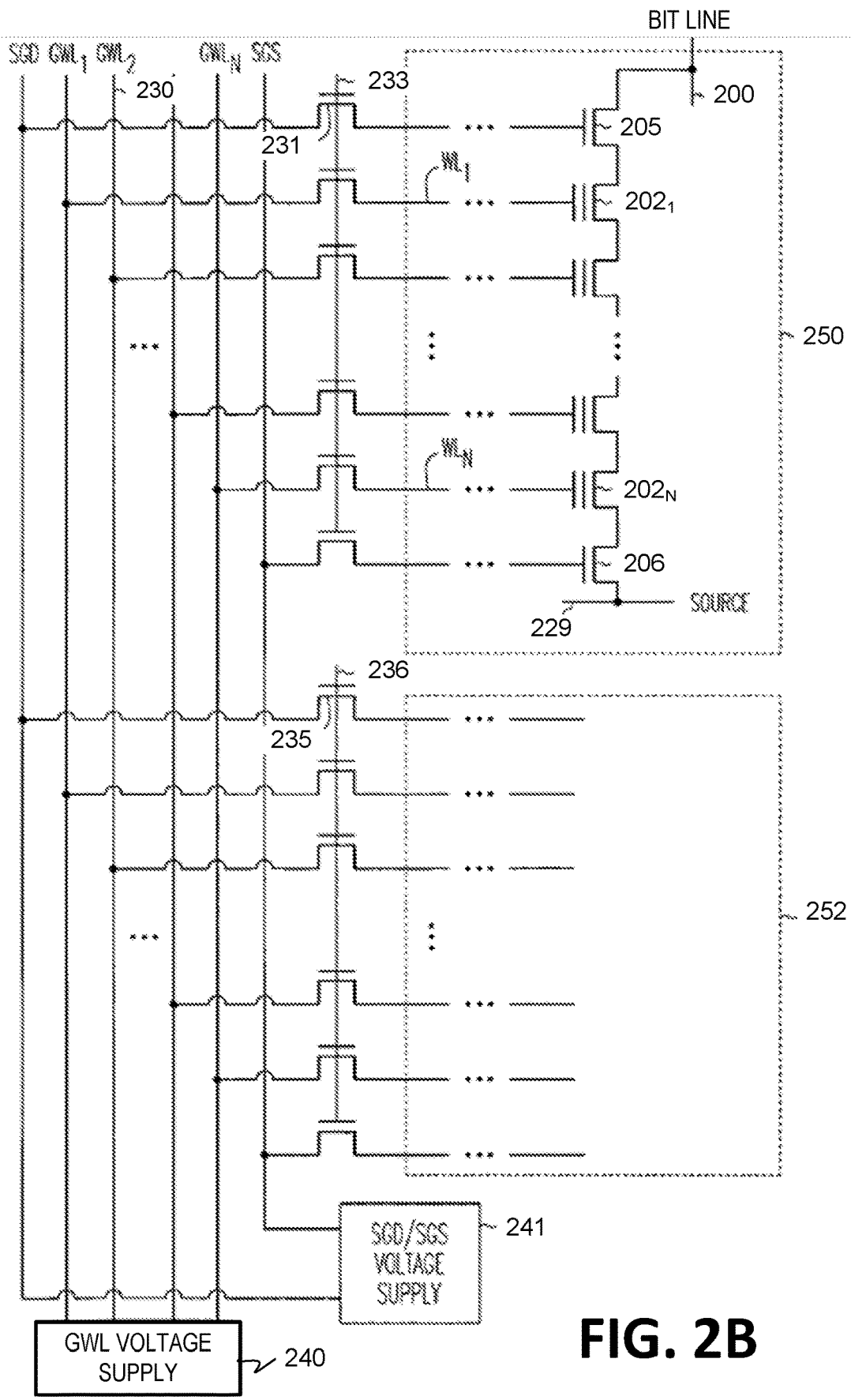
FIG. 2B illustrates a simplified portion of the memory array of the memory device of FIG. 2A, according to some embodiments.

FIG. 2B illustrates a simplified portion of the array of memory cells 204 of the memory device 130 of FIG. 2A, according to some embodiments. For simplicity, two array blocks 250 and 252 are illustrated. For purposes of explaining operation of the memory block, block 250 is referred to herein as being a selected block because a memory cell in that block is selected for programming. Block 252 is referred to herein as being an unselected block because it does not contain the memory cell selected for programming.

In array block 250, a bit line 200 is coupled to a series of non-volatile floating gate transistor memory cells $202_1$-$202n$ via drain select transistor 205. The memory cells are coupled to a source line 229 via a source select transistor 206. Control gates of the memory cells are coupled to wordlines ($WL_1$-$WL_n$), which are also referred to as local wordlines (LWL).

Each LWL can be selectively coupled to one of multiple global wordlines (GWL) 230 through a driver transistor 231.

For example, each of the local wordlines $WL_1$ of each array block 250 and 252 can be coupled to $GWL_1$, each of the local wordlines $WL_2$ of each array block 250 and 252 can be coupled to $GWL_2$, and so forth through local wordlines $WL_n$ being coupled to $GWL_n$. In this way, each global wordline (GWL) can separately control corresponding local wordlines (LWLs) from each array block. Each GWL is coupled to receive voltages from a voltage supply 240. A voltage supply 241 is coupled to provide a gate voltage to the drain select transistor 205 and the source select transistor 206.

During operation, the gate 233 of driver transistors 231 of array block 250 are controlled to couple all of the wordlines (LWL) of a NAND group of memory cells to selected voltage levels. The term global wordlines (GWL) refers to the hierarchical structure of wordline conductors. As such, the GWLs are used to provide signals to multiple wordlines (LWL) of the array. Block 252, and any other unselected blocks in the array, are coupled to a wordline pre-charge voltage through driver transistors 235 and a respective driver gate signal on gate 236.

In embodiments, LWL of selected and unselected blocks are pre-charged to a low level, such as one volt. The pre-charge voltage can be coupled through the GWLs 230 and driver transistors 231 and 235, or a secondary biasing circuit. Further, the pre-charge operation can be limited to the unselected blocks in some embodiments.

Figure 3:
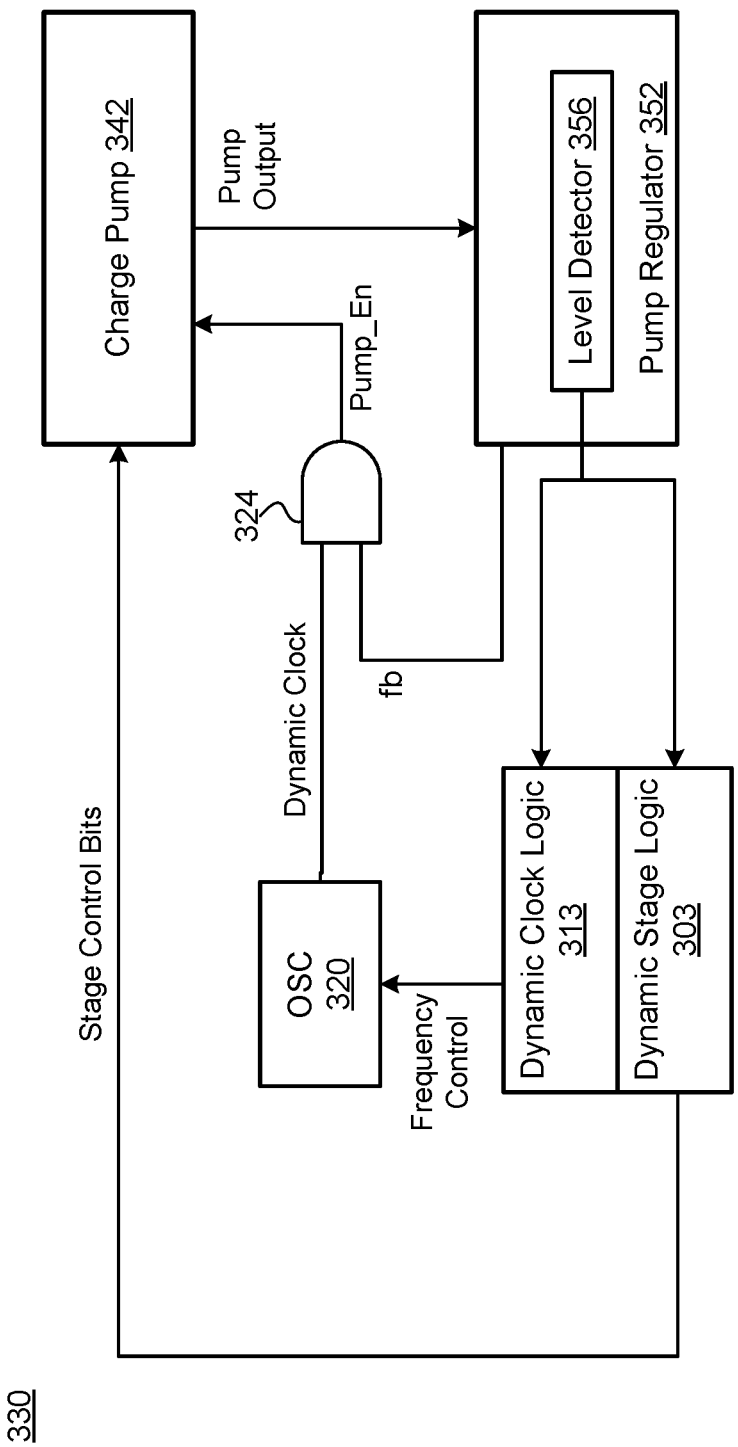
FIG. 3 is a block diagram of an example memory device having a charge pump driven by a dynamically updated clock according to an embodiment.

FIG. 3 is a block diagram of an example memory device 330 having a charge pump 342 driven by a dynamically updated clock according to an embodiment. In at least one embodiment, the memory device 330 is the memory device 130 of FIG. 1. In some embodiments, at least some of the components illustrated in FIG. 3 are located within the GWL voltage supply 240 that provides charge to the GWLs (FIG. 2B). In various embodiments, the memory device 330 includes the charge pump 342 operatively coupled with one or more wordlines (e.g., GWL(s)) of a memory array, e.g., the array blocks 250 and 252. In these embodiments, the memory device 330 further includes a pump regulator 352 coupled with the charge pump 342 and that includes a level detector 356, which detects a voltage level from a pump output of the charge pump 342.

In various embodiments, the memory device 330 further includes an oscillator 320 that provides a clock signal to an AND gate 324, which in turns provides a pump enable (pump_en) signal to the charge pump 342. The clock signal from the oscillator 320 is one input to the AND gate 324 while a feedback signal (fb) from the pump regulator 352 is a second input to the AND gate 324. This feedback signal is to trigger an output of the AND gate 324 to disable the charge pump 342, e.g., at the start of a recovery period during which the wordlines are discharged. Thus, the recovery period can be understood as being in a recovery state so that charged wordlines (and/or bit lines) are allowed to discharge in preparation for another memory access operation.

In some embodiments, the memory device 330 further includes dynamic stage logic 303 coupled between the level detector 356 and the charge pump 342 and dynamic clock logic 313 coupled between the level detector 356 and the oscillator 320. The dynamic stage logic 303 and the dynamic clock logic 313 can be logic (such as firmware, hardware, or a combination thereof) located on die of the memory device, where in some embodiments, the logic is included within the local media controller 135. In some embodiments, the dynamic stage logic 303 is adapted to track the voltage level of the pump output and generate stage control bits that work to keep the charge pump 342 working at a maximum efficiency. Further, in some embodiments, the dynamic clock logic 313 can reuse at least a part of or be integrated with the dynamic stage logic 303, making this particular implementation resource efficient. Further, the disclosed dynamic clocking can work alongside dynamic stage reconfiguration to achieve improved peak current values from the charge pump 342 into the wordlines.

Figure 4A:
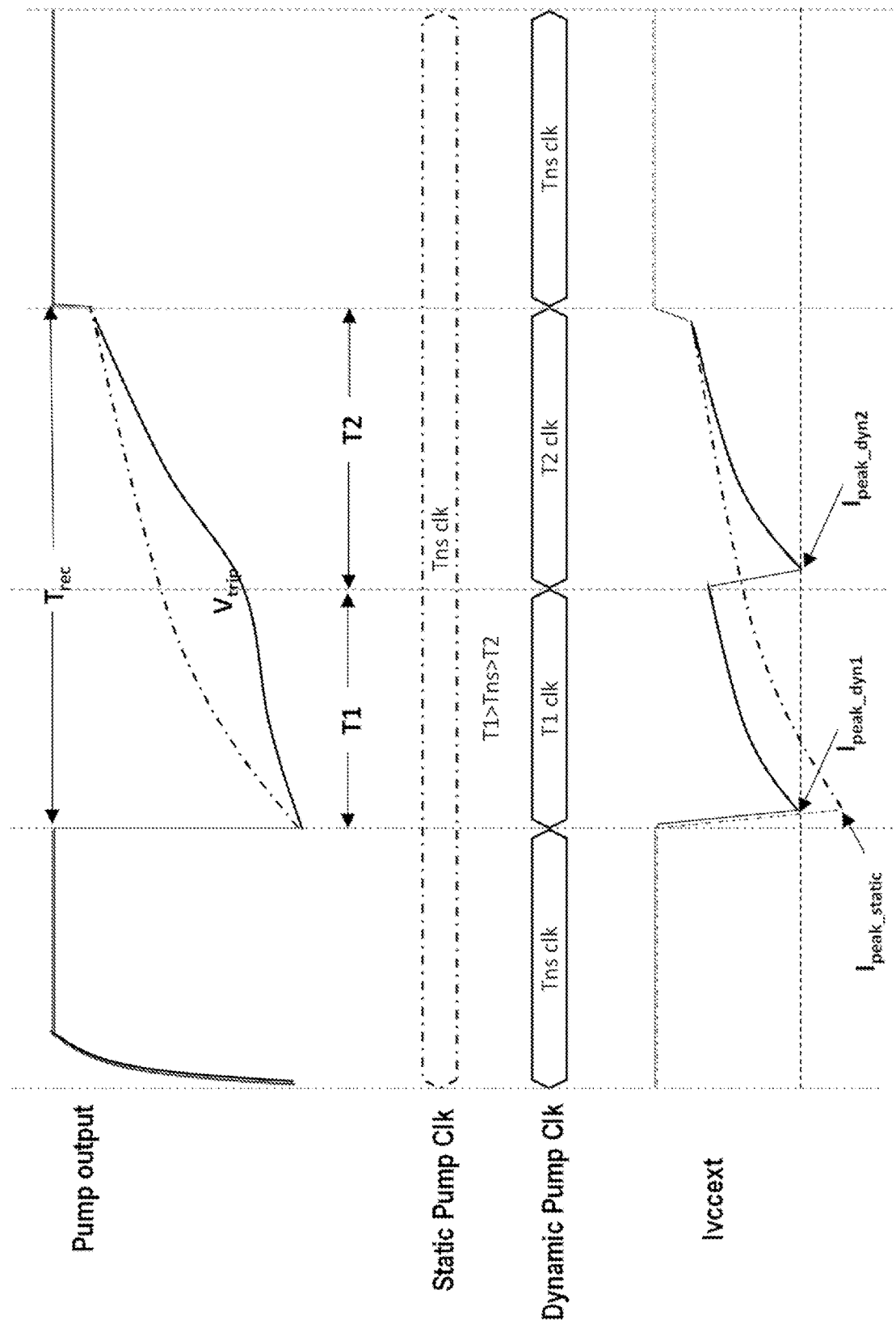
FIG. 4A is a graph including timing plots of dynamic clocking of the charge pump during a recovery period using a voltage trip point, according to an embodiments.

With additional reference to FIG. 4A, FIG. 4A is a graph including timing plots of dynamic clocking of the charge pump 342 during a recovery period using a voltage trip point, according to an embodiments. In these embodiments, the dynamic clock logic 313 detects that the charge pump 342 has entered a recovery period, e.g., $T_{rec}$ illustrated in FIG. 4A. The dynamic clock logic 313 can further cause (e.g., in response to detecting that the charge pump 342 has entered the recovery period) the oscillator 320 to output, to the charge pump 342 during a first time period (T1) of the recovery period, a first clock signal having a lower frequency than output during a time period preceding (e.g., immediate preceding) the recovery period. The time period (e.g., T0) preceding the recovery period can be understood to be a period during which the oscillator 320 is outputting an initial frequency. In some embodiments, the length of the first time period is at least a fourth longer than that of the time period (Tns) preceding the recovery period. As illustrated in the Ivccext waveform at the bottom of FIG. 4A, this lower frequency (compared to the initial frequency) can help reduce the peak current to at least 20% or more of the peak current exhibited with a static clock (compare $i_{peak\_static}$ with $I_{peak\_dyn1}$).

With further reference to FIG. 3 and FIG. 4A, the dynamic logic 313 can further detect that a voltage level from the level detector satisfies a trip point criterion, e.g., a trip point value ($V_{trip}$). The dynamic logic 313 can further cause the oscillator 320 to output, to the charge pump 342 during a second time period (T2) of the recovery period and responsive to detecting that the voltage level from the level detector satisfies the trip point criterion, a second clock signal having a higher frequency (compared to the initial frequency) than output during the time period preceding (e.g., immediately preceding) the recovery period. For example, a length of the second time period can be at least a third shorter than that of the time period (Tns) preceding the recovery period. Further, in this example, the higher frequency is twice as fast as the lower frequency, thus allowing performance of the dynamic clock to catch up during the second period. The dynamic logic 313 can further, upon exiting the recovery period, cause the oscillator 320 to output a static clock signal of a frequency that is substantially equal to that output during the time period preceding the recovery period, e.g., the Tns clock cycle. To be substantially equal, for example, can refer to within plus or minus one or two percent.

In the above-described embodiments, the dynamic logic 313 can solve for certain criteria in order to calculate the voltage level of the trip point criterion ($V_{trip}$) where the now two current peaks are minimized, e.g., $i_{peak\_dyn}$=min ($I_{peak\_dyn1}$, $I_{peak\_dyn2}$), and retains the same recovery time. In one embodiment, a first of the criteria includes that two peak currents from the charge pump 342 during the recovery period are approximately equal, e.g., $I_{peak\_dyn1}$=$I_{peak\_dyn2}$. A second of the criteria can include that a combination of the first time period and the second time period are approximately equal to an entirety of the recovery period, e.g., $T1+T2=T_{rec}$. With known timing constraints of the recovery period and other parameters, these two equations can be solved to determine the voltage level of the trip point at which the frequency of the dynamic clock signal is to be shifted higher to achieve the performance saving after the peak current has been minimized. Equations (1), (2), and (3) illustrate one such set of equations.

By substituting Equations (1) and (2) for T1 and T2, respectively, into Equation (3), one can solve for $V_{trip}$.

$$T_1 = \frac{NC_{load}}{f_{min}C_{pmp}}\left[\frac{V_{max} - V_{start}}{V_{max} - V_{trip}}\right] \quad (1)$$

$$T_2 = \frac{NC_{load}}{f_{max}C_{pmp}}\left[\frac{V_{max} - V_{trip}}{V_{max} - V_{final}}\right] \quad (2)$$

$$T_1 + T_2 = \frac{NC_{load}}{fC_{pmp}}\left[\frac{V_{max} - V_{start}}{V_{max} - V_{final}}\right] \quad (3)$$

In Equations (1), (2), and (3), N is the number of pump stages, $C_{load}$ is the capacitive load of the pump, $C_{pump}$ is the capacitance of each stage, $V_{max}$ is the maximum pump output voltage, $V_{start}$ is the initial voltage of the charge pump 342, $V_{final}$ is the desired final voltage, f is the static frequency, $f_{min}$ is the minimum (or lowest) frequency and $f_{max}$ is the maximum (or highest) frequency.

Figure 4B:
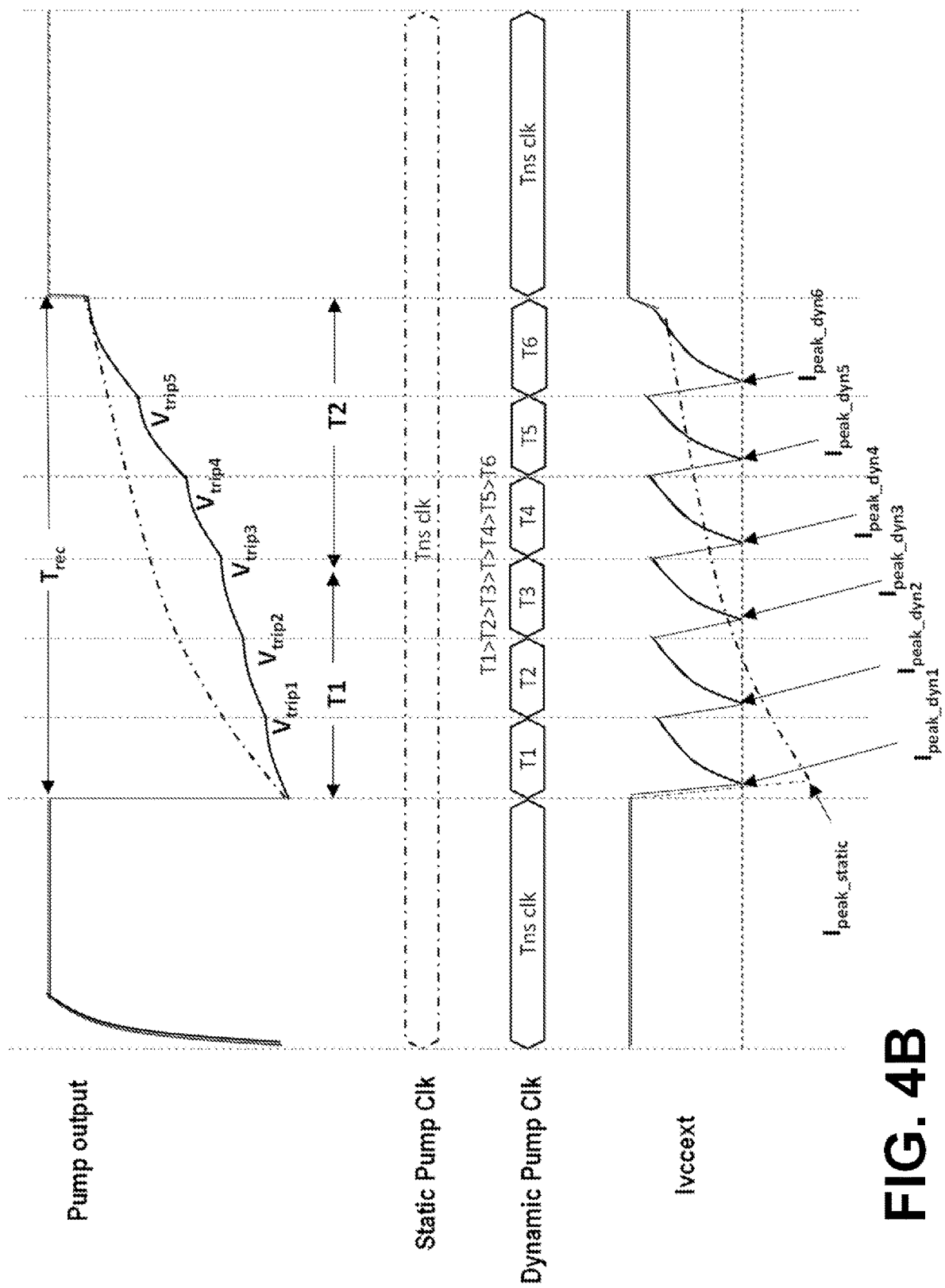
FIG. 4B is a graph including timing plots of dynamic clocking of the charge pump during a recovery period using multiple voltage trip points, according to various embodiments.

FIG. 4B is a graph including timing plots of dynamic clocking of the charge pump during a recovery period using multiple voltage trip points, according to various embodiments. For example, the example of FIG. 4A can be extended to multiple trip points ($V_{trip1}$ . . . $V_{tripn}$) and breaking the recovery period in n substantially equal time periods, where the clock starts at a lowest frequency during the first time period (T1) and finishes at a highest frequency during the final time period (Tn). Thus, the dynamic clock causes the time periods to gradually decrease in length (T1>T2>T3>T4>T5> . . . >Tn). The example of FIG. 4B chooses n to be six ("6") for purposes of illustration, as the value for n can be chosen as higher or lower than 6. In this way, the dynamic clock logic 313 can also perform current shaping to generate, in some embodiments, a current from the charge pump during the recovery operation that becomes progressively flatter up to and potentially becoming rectangular in shape. Further, performing additional current shaping in this way can also cause a larger percentage drop in maximum (or peak) current during the recovery period.

Thus, in one embodiment, where just a third period is added, the trip point criterion can be considered a second trip point criterion ($V_{trip2}$), and the dynamic clock logic can 313 further detect a voltage level from the charge pump satisfy a first trip point criterion ($V_{trip1}$). The dynamic clock logic 313 can further cause the oscillator 320 to output, to the charge pump during the third time period between the first time period and the second time period and responsive to detecting the first trip point criterion, a third clock signal having an intermediate frequency between the higher frequency and the lower frequency. Thus, the dynamic clock logic 313 can solve for the first trip point criterion and the second trip point criterion by solving for criteria that includes: 1) three peak currents from the charge pump during the recovery period are approximately equal, and a combination of the first time period, the second time period; and 2) the third time period are approximately equal to an entirety of the recovery period.

In other embodiments, particularly with reference to current shaping that also minimizes peak current, the trip point criterion further includes multiple trip point values (e.g., more than two in this case), and the trip point criterion is a final trip point value of the multiple trip point values. The dynamic logic 313 can solve for certain criteria in order to calculate the voltage levels of the multiple trip point values where the multiple current peaks are minimized, e.g., $I_{peak\_dyn}$=min($I_{peak\_dyn1}$, $I_{peak\_dyn2}$, $I_{peak\_dyn3}$, $I_{peak\_dyn4}$, $I_{peak\_dyn5}$, $I_{peak\_dyn6}$) for six time periods, and retain the same recovery time. In one embodiment, a first of the criteria includes that the multiple peak currents from the charge pump 342 during the recovery period are approximately equal, e.g., $I_{peak\_dyn1}$=$I_{peak\_dyn2}$=$I_{peak\_dyn3}$=$I_{peak\_dyn4}$=$I_{peak\_dyn5}$=$I_{peak\_dyn6}$. Being approximately equal, for example, can mean within one to two percent of each other. A second of the criteria can include that a combination of the multiple time periods (T1 . . . Tn) are approximately equal to an entirety of the recovery period, e.g., $T_1+T_2+T_3+T_4+T_5+T_6=T_{rec}$. With known timing constraints of the recovery period and other parameters, these two equations can be solved to determine the voltage level of the trip point at which the frequency of each dynamic clock signal is to be shifted higher to achieve the performance saving after the peak currents have been minimized. For example, Equations (1), (2), and (3) can be extended to cover additional time periods and trip points to be solved to determine the trip point values of the voltage levels.

In this more generalized embodiment, the dynamic clock logic 313 can detect each of multiple voltage levels from the charge pump 342 that satisfy each respective trip point value of multiple trip point values. The dynamic clock logic 313 can further cause the oscillator 320 to output, to the charge pump 342 sequentially during each of the multiple time periods and in response to detecting a respective voltage level of the plurality of voltage levels, a subsequent clock signal of multiple clock signals. Each subsequent clock signal can include an increasingly higher frequency such that a final clock signal during a final time period of the plurality of time periods has a highest frequency of the multiple clock signals.

Figure 5A:
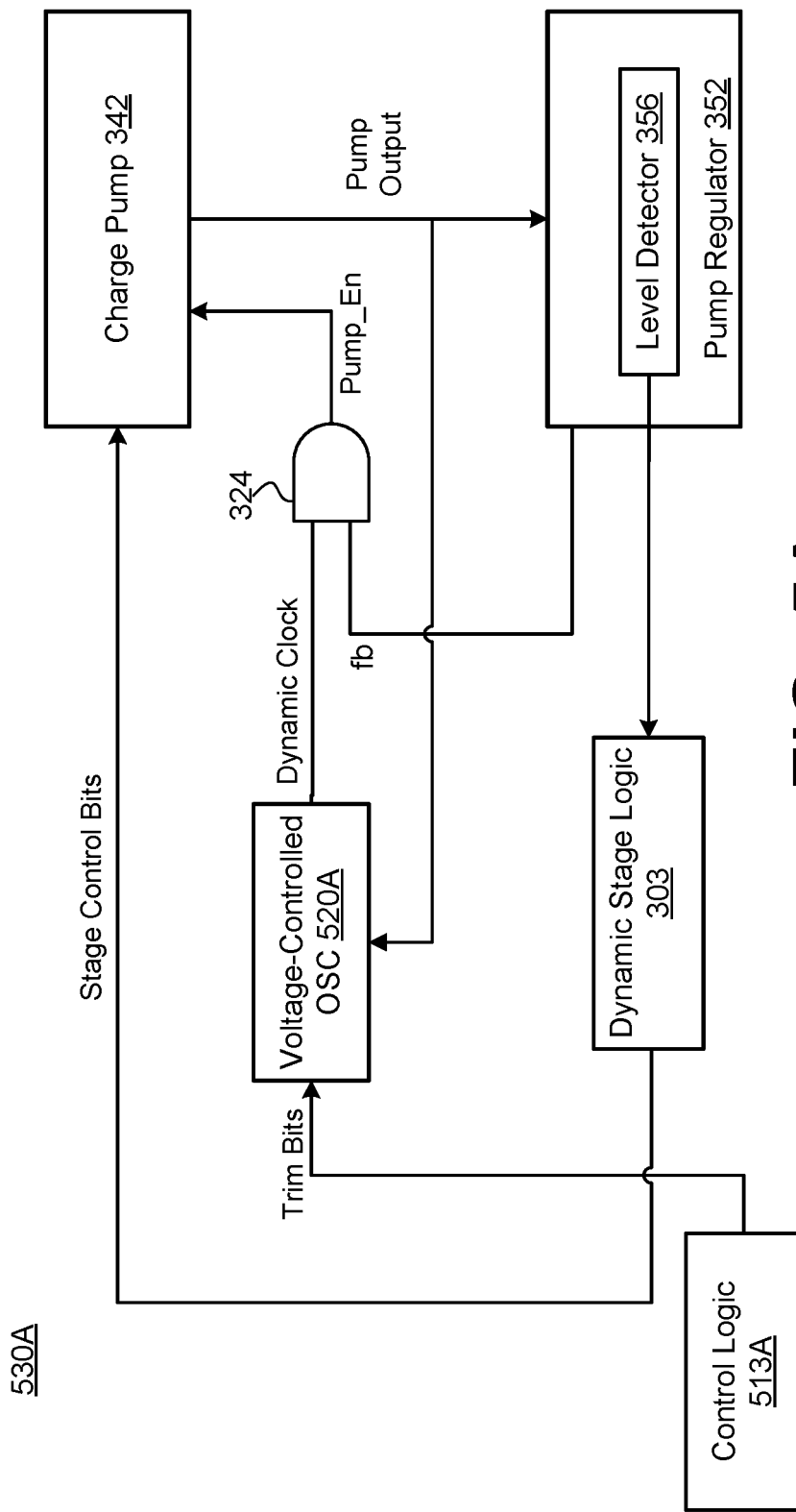
FIG. 5A is a block diagram of an example memory device having a charge pump driven by a dynamically updated clock according to another embodiment.

FIG. 5A is a block diagram of an example memory device 530A having a charge pump 342 driven by a dynamically updated clock according to another embodiment. In at least one embodiment, the memory device 530A is the memory device 130 of FIG. 1. As a variation to the embodiment of FIG. 3, the memory device 530A reduces reliance on the dynamic clock logic 313, and instead employs a voltage-controller oscillator 520A coupled with (e.g., connected to) an output of the charge pump. The voltage-controlled oscillator 520A can be controlled via trim bits to provide clock signals to the charge pump 342 depending on a voltage level of the output of the charge pump 342. In some embodiments, control logic 513A (e.g., which can be the dynamic clock logic 113 and/or the local media controller 135) can provide the trim bits, e.g., that cause the voltage-controlled oscillator 520A to vary the frequency associated with different voltage levels of the charge pump output, e.g., corresponding to the trip point criterion or values ($V_{trip}$).

In these embodiments, the voltage-controlled oscillator 520A can detect that the charge pump 342 has entered a recovery period. The voltage-controlled oscillator 520A can further output, to the charge pump 342 during a first time period of the recovery period and responsive to detecting entry into the recovery period, a first clock signal having a lower frequency than output during a time period preceding the recovery period. The voltage-controlled oscillator 520A can further detect that a voltage level from the charge pump satisfies a trip point criterion. The voltage-controlled oscillator 520A can further output, to the charge pump 342 during a second time period of the recovery period, a second clock signal having a higher frequency than output during the time period preceding the recovery period.

Other functionality of the dynamic clocking of the memory device 503A can be similar to that described with reference to FIG. 3, except that the trim bits from control logic now dictate the locations of the trim points ($V_{trim}$). For example, the control logic can be coupled with the voltage-controlled oscillator 520A and be adapted to perform second operations including determining the trip point criterion by solving for criteria including: 1) two peak currents from the charge pump during the recovery period are approximately equal; and 2) a combination of the first time period and the second time period are approximately equal to an entirety of the recovery period. The control logic can further transmit trim bits to the voltage-controlled oscillator indicative of the trip point criterion.

In an extended embodiment including two trip points, the control logic determines the first trip point criterion and the second trip point criterion by solving for criteria including: 1) three peak currents from the charge pump 342 during the recovery period are approximately equal; and 2) a combination of the first time period, the second time period, and the third time period are approximately equal to an entirety of the recovery period. The control logic can further transmit trim bits to the voltage-controlled oscillator 520A indicative of the first trip point criterion and the second trip point criterion.

Figure 5B:
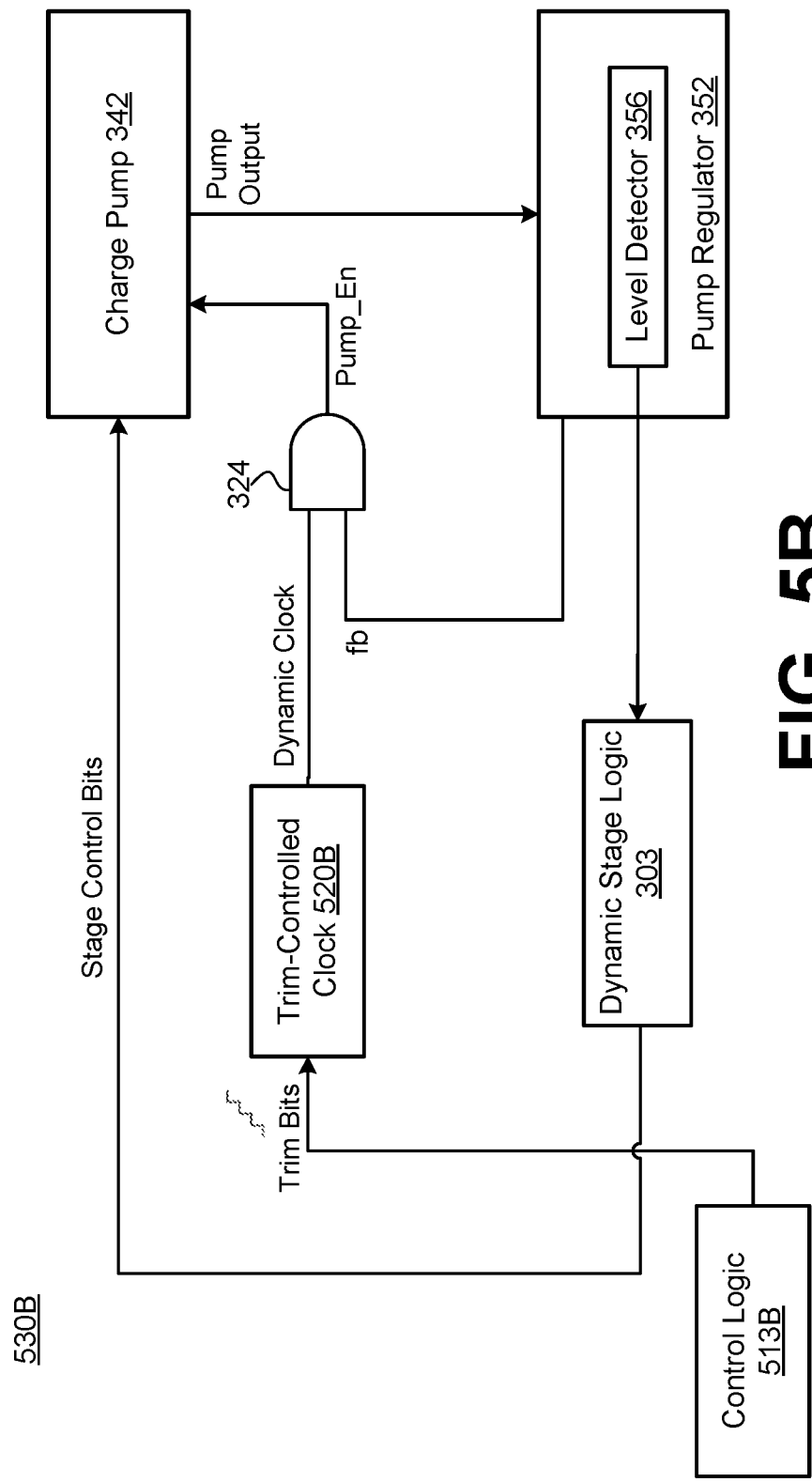
FIG. 5B is a block diagram of an example memory device having a charge pump driven by a dynamically updated clock according to a further embodiment.

FIG. 5B is a block diagram of an example memory device 530B having a charge pump 342 driven by a dynamically updated clock according to a further embodiment. In at least one embodiment, the memory device 130 is the memory device 130 of FIG. 1. As a variation to the embodiment of FIG. 3, the memory device 530B reduces reliance on the dynamic clock logic 313, and instead employs a trim-controlled clock 520B coupled with (e.g., connected to) an output of the charge pump 342. The trim-controlled clock 520B can be an oscillator in one embodiment that steps to different frequencies in an output clock based on trim levels received at the input of the clock. Again, control logic 513A (e.g., which can be the dynamic clock logic 113 and/or the local media controller 135) can provide the trim bits.

In some embodiments, the control logic 513A, for example, knows when the charge pump 342 enters into a recovery period and starts sending trim bits that control frequency stepping within the trim-controlled clock 520B. This frequency stepping, for example, can be a pre-programmed sequence of a certain number of time periods, each time period causing the trim-controlled clock 520B to step to an incrementally higher frequency clock. In these embodiments, the number of time periods is calculated to end at approximately the end of a known amount of time of the recovery period. The trim bits can be a pre-approximation of dynamic clocking without the need to conduct real-time calculations during each recovery period, and thus provide a simplified, low-resource implementation of dynamic clocking.

In some embodiments of two time periods, the frequency stepping includes outputting, to the charge pump 342 during a first time period of the recovery period, a first clock signal having a lower frequency than output during a time period preceding the recovery period and outputting, to the charge pump 342 during a second time period of the recovery period, a second clock signal having a higher frequency than output during the time period preceding the recovery period. In some embodiments, the first time period is at least a fourth longer than that of the time period preceding the recovery period and the second time period is at least a third shorter than that of the time period preceding the recovery period.

In related embodiments, the trim bits cause frequency stepping between the first time period and the second time period to be approximately timed to satisfy criteria including that: two peak currents from the charge pump 342 during the recovery period are approximately equal; and a combination of the first time period and the second time period are approximately equal to an entirety of the recovery period.

In some embodiments, the frequency stepping further includes outputting, to the charge pump 342 during a third time period between the first time period and the second time period, a third clock signal having an intermediate frequency between the higher frequency and the lower frequency. In extended embodiments, the frequency stepping further includes outputting, to the charge pump 342 sequentially during each of multiple time periods, a subsequent clock signal of multiple clock signals, which include the first clock signal and the second clock signal. Each subsequent clock signal can include an increasingly higher frequency such that a final clock signal during a final time period of multiple time periods has a highest frequency of the plurality of clock signals.

Figure 6:
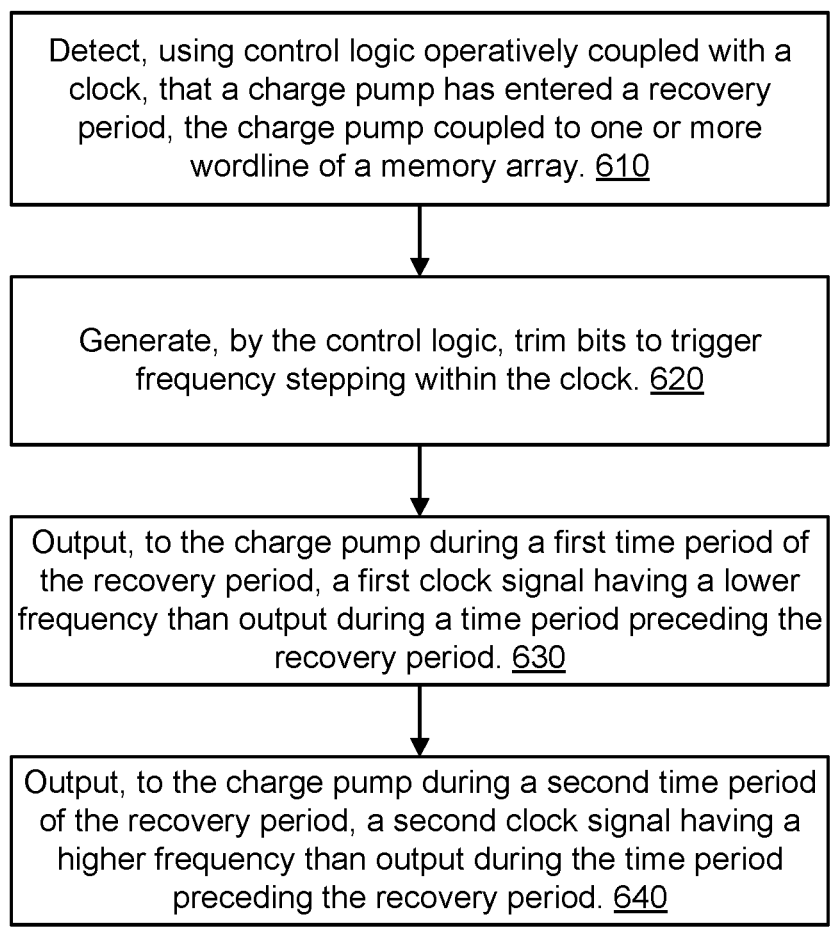
FIG. 6 is a flow diagram of an example method of dynamically updating a clock that drives a charge pump during a recovery period, in accordance with one or more embodiments.

FIG. 6 is a flow diagram of an example method of dynamically updating a clock that drives a charge pump during a recovery period, in accordance with one or more embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. For example, method 600 can be performed by one or more components of device 330, 530A, or 530B, as described in detail above with reference to FIGS. 3-5B. In some embodiments, the method 600 is performed by the control logic 513B, which can include the dynamic clock logic 113 and/or logic of the local media controller 135 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 610, a recovery period is detected. More specifically, the processing logic detects that a charge pump has entered a recovery period, the charge pump coupled to one or more wordline of a memory array.

At operation 620, trim bits are generated. More specifically, the processing logic generates trim bits to trigger frequency stepping within the clock. This clock can be, for example, the trim-controlled clock 520B of FIG. 5B. The trim bits can cause frequency stepping within the trim-controlled clock 520B, which is detailed in operations 630 and 640.

At operation 630, a first clock signal is triggered. More specifically, in response to the occurrence of operation 610, the trim bits cause the clock to output, to the charge pump during a first time period of the recovery period, a first clock signal having a lower frequency than output during a time period preceding the recovery period.

At operation 640, a second clock signal is triggered. More specifically, in response to the occurrence of operation 630, the trim bits cause the clock to output, to the charge pump during a second time period of the recovery period, a second clock signal having a higher frequency than output during the time period preceding the recovery period.

Figure 7:
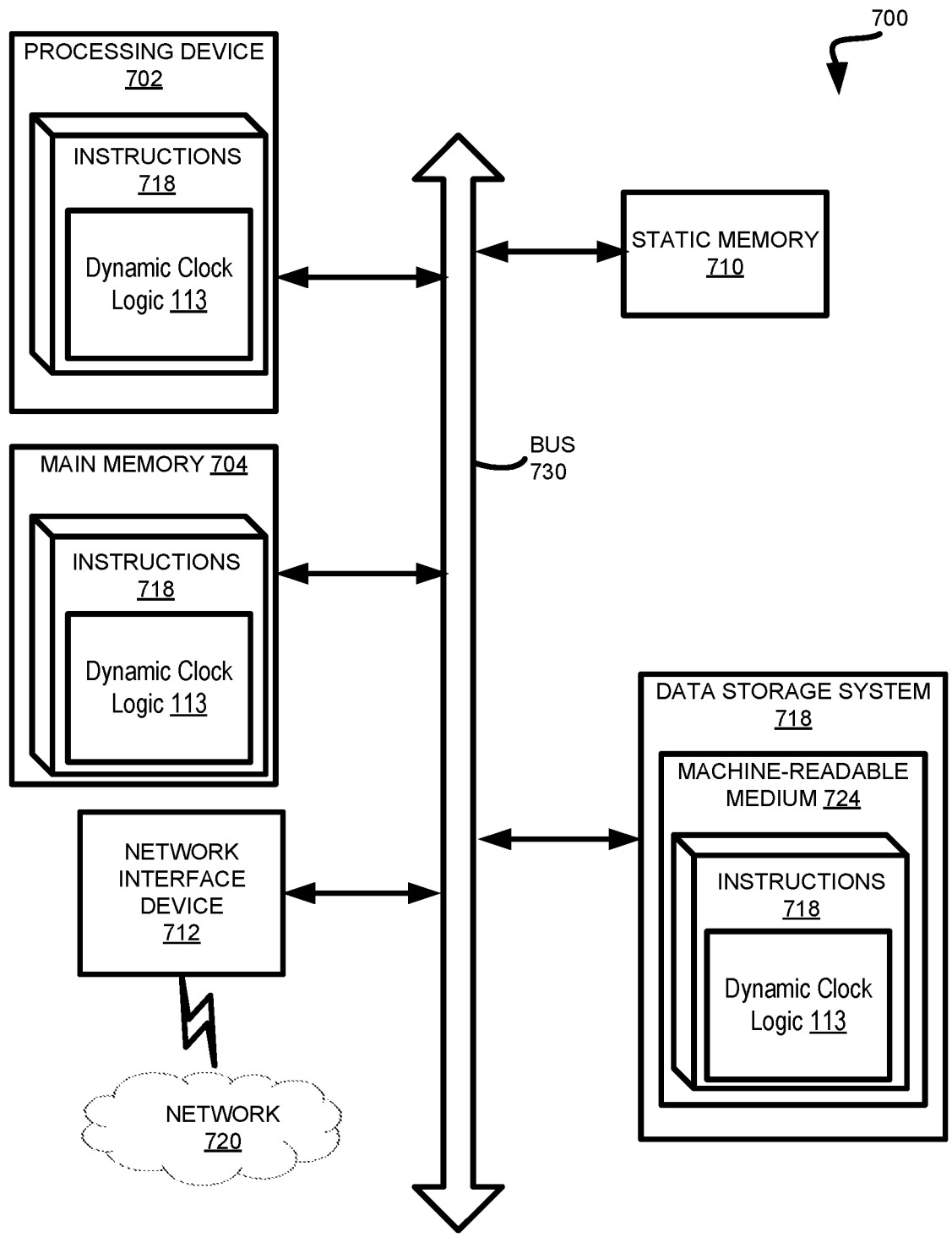
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the dynamic clock logic 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to directing dynamic clocking (e.g., dynamic clock logic 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium," or equally "non-transitory computer readable medium," shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a charge pump operatively coupled with one or more wordlines of a memory array;
a pump regulator coupled with the charge pump and comprising a level detector; and
dynamic clock logic coupled between the level detector and an oscillator that provides clock signals to the charge pump, wherein the dynamic clock logic is to perform operations comprising:
detecting that the charge pump has entered a recovery period;
causing the oscillator to output, to the charge pump during a first time period of the recovery period, a first clock signal comprising a lower frequency than output during a time period preceding the recovery period;
detecting that a voltage level from the level detector satisfies a trip point criterion; and
causing the oscillator to output, to the charge pump during a second time period of the recovery period and responsive to the detecting that the voltage level from the level detector satisfies the trip point criterion, a second clock signal comprising a higher frequency than output during the time period preceding the recovery period.

2. The system of claim 1, wherein the first time period is at least a fourth longer than that of the time period preceding the recovery period and the second time period is at least a third shorter than that of the time period preceding the recovery period.

3. The system of claim 1, wherein the operations further comprise, upon exiting the recovery period, causing the oscillator to output a static clock signal of a frequency that is substantially equal to that output during the time period preceding the recovery period.

4. The system of claim 1, wherein the operations further comprise determining the trip point criterion by solving for criteria comprising:
two peak currents from the charge pump during the recovery period are approximately equal; and
a combination of the first time period and the second time period are approximately equal to an entirety of the recovery period.

5. The system of claim 1, wherein the trip point criterion comprises a second trip point criterion, wherein the operations further comprise:
detecting that a voltage level from the charge pump satisfies a first trip point criterion; and
causing the oscillator to output, to the charge pump during a third time period between the first time period and the second time period and responsive to detecting the first trip point criterion, a third clock signal comprising an intermediate frequency between the higher frequency and the lower frequency.

6. The system of claim 5, wherein the operations further comprise determining the first trip point criterion and the second trip point criterion by solving for criteria comprising:
three peak currents from the charge pump during the recovery period are approximately equal; and
a combination of the first time period, the second time period, and the third time period are approximately equal to an entirety of the recovery period.

7. The system of claim 1, wherein the trip point criterion further comprises a plurality of trip point values, the trip point criterion is a final trip point value of the plurality of trip point values, and wherein the operations further comprise:
detecting each of a plurality of voltage levels from the charge pump that satisfy each respective trip point value of the plurality of trip point values; and
causing the oscillator to output, to the charge pump sequentially during each of a plurality of time periods in response to detecting a respective voltage level of the plurality of voltage levels, a subsequent clock signal of a plurality of clock signals, which include the first clock signal and the second clock signal, wherein each subsequent clock signal comprises an increasingly higher frequency such that a final clock signal during a final time period of the plurality of time periods has a highest frequency of the plurality of clock signals.

8. An apparatus comprising:
a charge pump operatively coupled with one or more wordlines of a memory array; and
a voltage-controlled oscillator coupled with an output of the charge pump, the voltage-controlled oscillator to provide clock signals to the charge pump depending on a voltage level of the output of the charge pump, wherein the voltage-controlled oscillator is to perform operations comprising:
detecting that the charge pump has entered a recovery period;
outputting, to the charge pump during a first time period of the recovery period and responsive to the detecting that the charge pump has entered the recovery period, a first clock signal comprising a lower frequency than output during a time period preceding the recovery period;
detecting that a voltage level from the charge pump satisfies a trip point criterion; and
outputting, to the charge pump during a second time period of the recovery period, a second clock signal comprising a higher frequency than output during the time period preceding the recovery period.

9. The apparatus of claim 8, wherein the first time period is at least a fourth longer than that of the time period preceding the recovery period and the second time period is at least a third shorter than that of the time period preceding the recovery period.

10. The apparatus of claim 8, wherein the operations further comprise, upon exiting the recovery period, outputting a static clock signal of a frequency that is substantially equal to that output during the time period preceding the recovery period.

11. The apparatus of claim 8, further comprising control logic coupled with the voltage-controlled oscillator, wherein the control logic is to perform second operations comprising:
determining the trip point criterion by solving for criteria including:
two peak currents from the charge pump during the recovery period are approximately equal; and
a combination of the first time period and the second time period are approximately equal to an entirety of the recovery period; and
transmitting trim bits to the voltage-controlled oscillator indicative of the trip point criterion.

12. The apparatus of claim 8, wherein the trip point criterion comprises a second trip point criterion, wherein the operations further comprise:
detecting that a voltage level from the charge pump satisfies a first trip point criterion; and
outputting, to the charge pump during a third time period between the first time period and the second time period and responsive to detecting the first trip point criterion, a third clock signal comprising an intermediate frequency between the higher frequency and the lower frequency.

13. The apparatus of claim 12, further comprising control logic coupled to the voltage-controlled oscillator, wherein the control logic is to perform second operations comprising:
determining the first trip point criterion and the second trip point criterion by solving for criteria including:
three peak currents from the charge pump during the recovery period are approximately equal; and
a combination of the first time period, the second time period, and the third time period are approximately equal to an entirety of the recovery period; and
transmitting trim bits to the voltage-controlled oscillator indicative of the first trip point criterion and the second trip point criterion.

14. The apparatus of claim 8, wherein the trip point criterion further comprises a plurality of trip point values, the trip point criterion is a final trip point value of the plurality of trip point values, and wherein the operations further comprise:
detecting each of a plurality of voltage levels from the charge pump that satisfy each respective trip point value of the plurality of trip point values; and
outputting, to the charge pump sequentially during each of a plurality of time periods in response to detecting a respective voltage level of the plurality of voltage levels, a subsequent clock signal of a plurality of clock signals, which include the first clock signal and the second clock signal, wherein each subsequent clock signal comprises an increasingly higher frequency such that a final clock signal during a final time period of the plurality of time periods has a highest frequency of the plurality of clock signals.

15. A method comprising:
detecting, using control logic operatively coupled with a clock, that a charge pump has entered a recovery period, the charge pump coupled to one or more wordline of a memory array; and
generating, by the control logic, trim bits to trigger frequency stepping within the clock, wherein the frequency stepping comprises:
outputting, to the charge pump during a first time period of the recovery period, a first clock signal comprising a lower frequency than output during a time period preceding the recovery period; and
outputting, to the charge pump during a second time period of the recovery period, a second clock signal comprising a higher frequency than output during the time period preceding the recovery period.

16. The method of claim 15, wherein the first time period is at least a fourth longer than that of the time period preceding the recovery period and the second time period is at least a third shorter than that of the time period preceding the recovery period.

17. The method of claim 15, further comprising, upon exiting the recovery period, causing the clock to output a static clock signal of a frequency that is substantially equal to that output during the time period preceding the recovery period.

18. The method of claim 15, wherein the trim bits cause frequency stepping between the first time period and the second time period to be approximately timed to satisfy criteria comprising:
two peak currents from the charge pump during the recovery period are approximately equal; and
a combination of the first time period and the second time period are approximately equal to an entirety of the recovery period.

19. The method of claim 15, wherein the frequency stepping further comprises outputting, to the charge pump during a third time period between the first time period and the second time period, a third clock signal comprising an intermediate frequency between the higher frequency and the lower frequency.

20. The method of claim 15, wherein the frequency stepping further comprises outputting, to the charge pump sequentially during each of a plurality of time periods, a subsequent clock signal of a plurality of clock signals, which include the first clock signal and the second clock signal, wherein each subsequent clock signal comprises an increasingly higher frequency such that a final clock signal during a final time period of the plurality of time periods has a highest frequency of the plurality of clock signals.

* * * * *